(12) United States Patent
Kim

(10) Patent No.: US 10,790,302 B2
(45) Date of Patent: Sep. 29, 2020

(54) SEMICONDUCTOR DEVICE AND METHOD OF MANUFACTURING THE SAME

(71) Applicant: SK hynix Inc., Icheon-si, Gyeonggi-do (KR)

(72) Inventor: Jin Ha Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/555,989

(22) Filed: Aug. 29, 2019

(65) Prior Publication Data

US 2019/0393242 A1    Dec. 26, 2019

Related U.S. Application Data

(62) Division of application No. 15/917,183, filed on Mar. 9, 2018, now Pat. No. 10,438,967.

(30) Foreign Application Priority Data

Aug. 18, 2017  (KR) .......................... 10-2017-0104897

(51) Int. Cl.
| | | |
|---|---|---|
| *H01L 27/11582* | (2017.01) | |
| *H01L 27/11556* | (2017.01) | |
| *H01L 29/165* | (2006.01) | |
| *H01L 29/10* | (2006.01) | |
| *H01L 27/1157* | (2017.01) | |
| *H01L 27/11524* | (2017.01) | |

(52) U.S. Cl.
CPC .... *H01L 27/11582* (2013.01); *H01L 27/1157* (2013.01); *H01L 27/11524* (2013.01); *H01L 27/11556* (2013.01); *H01L 29/1029* (2013.01); *H01L 29/165* (2013.01)

(58) Field of Classification Search
CPC ......... H01L 27/11582; H01L 27/11524; H01L 29/165; H01L 27/1157; H01L 29/1029; H01L 27/11556

See application file for complete search history.

(56) References Cited

U.S. PATENT DOCUMENTS

| | | | |
|---|---|---|---|
| 2013/0056814 A1 | 3/2013 | Higuchi | |
| 2013/0244388 A1* | 9/2013 | Scheiper | ......... H01L 21/823412 438/285 |
| 2014/0138687 A1* | 5/2014 | Lee | ................... H01L 29/66666 257/51 |
| 2016/0172370 A1* | 6/2016 | Makala | ............ H01L 27/11582 257/314 |
| 2017/0194057 A1 | 7/2017 | Lee et al. | |
| 2017/0213843 A1* | 7/2017 | Choi | ................ H01L 27/11582 |

FOREIGN PATENT DOCUMENTS

| | | |
|---|---|---|
| KR | 1020140063144 A | 5/2014 |
| KR | 1020160136249 A | 11/2016 |

\* cited by examiner

*Primary Examiner* — Galina G Yushina
(74) *Attorney, Agent, or Firm* — William Park & Associates Ltd.

(57) ABSTRACT

Provided herein is a semiconductor device and a method of manufacturing the same. The semiconductor device has improved erase characteristics by using a select gate enclosing a portion a first semiconductor region overlapping a second semiconductor region. The first semiconductor region and the second semiconductor region are formed of different semiconductor materials.

7 Claims, 14 Drawing Sheets

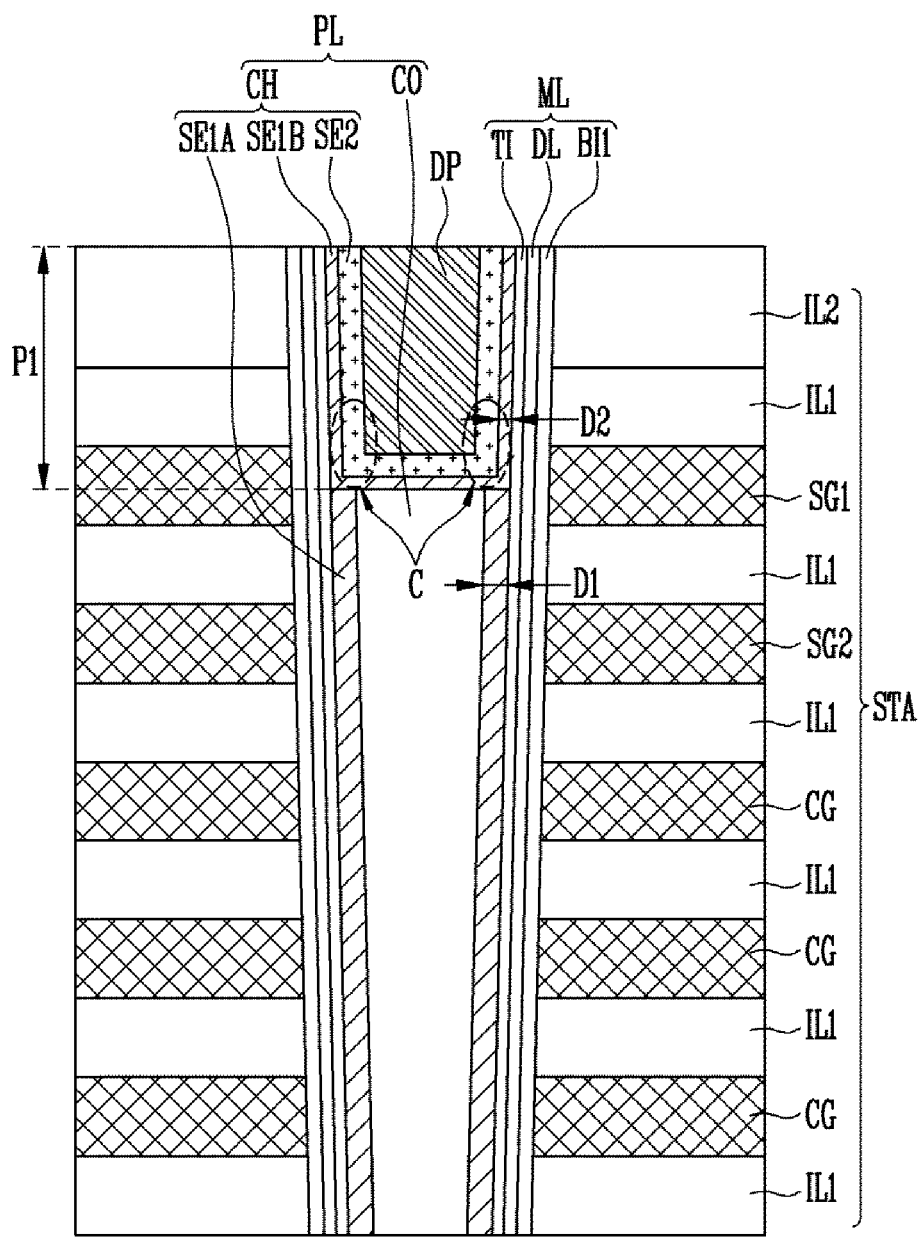

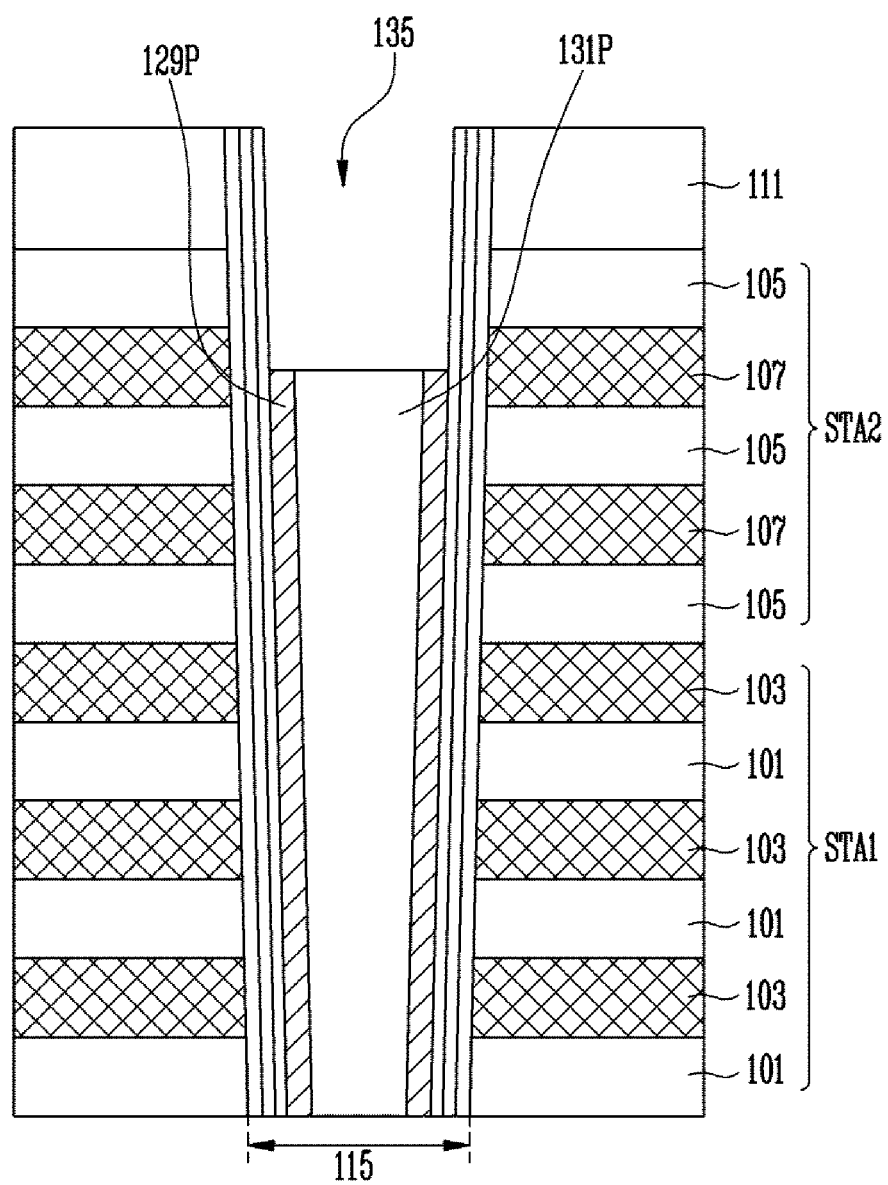

SEMICONDUCTOR DEVICE AND METHOD OF MANUFACTURING THE SAME

CROSS-REFERENCE TO RELATED APPLICATION

The present application is a divisional application of U.S. patent application Ser. No. 15/917,183, filed on Mar. 9, 2018, and claims priority under 35 U.S.C. § 119(a) to Korean patent application number 10-2017-0104897 filed on Aug. 18, 2017, in the Korean Intellectual Property Office, the entire disclosure of which is incorporated herein by reference.

BACKGROUND

1. Technical Field

Various embodiments of the present disclosure relate to a semiconductor device and a method of manufacturing the same, and more particularly, to a semiconductor device including a transistor and a method of manufacturing the same.

2. Related Art

A semiconductor device may include a memory cell array configured to store data. The memory cell array may include a memory cell transistor and a select transistor. The memory cell transistor may store data. When a program operation, such as an erase operation or a read operation is performed, the select transistor may determine whether to couple a channel with a signal line.

A memory cell array of a NAND flash memory device, for example, includes a memory string. The memory string may include a source select transistor, a drain select transistor, and a plurality of memory cell transistors which are coupled in series between the source select transistor and the drain select transistor. The source select transistor may determine whether to couple a source line with a channel of the memory string, and the drain select transistor may determine whether to couple a bit line with the channel of the memory string.

The select transistors and the memory cell transistors that form the memory cell array may be arranged in three dimensions to embody high integration of a semiconductor device. An erase operation of the three-dimensional semiconductor device may be performed by generating holes and supplying the holes to the channel of the memory string. The holes may be generated by a mechanism of generating gate induced drain leakage (GIDL) current using the select transistor. To improve the erase operation, a sufficient amount of holes must be generated.

SUMMARY

An embodiment of the present disclosure provides for a semiconductor device including a doped semiconductor layer doped with first conductivity type impurities. The semiconductor device also includes a channel pattern including a first semiconductor region and a second semiconductor region. The first semiconductor region encloses a sidewall of the doped semiconductor layer. The second semiconductor region is disposed between the first semiconductor region and the doped semiconductor layer. Also, the second semiconductor region is formed of semiconductor material that is different from semiconductor material from which the first semiconductor region is formed. The semiconductor device additionally includes a first select gate. The first select gate encloses a portion of the first semiconductor region overlapping the second semiconductor region.

Another embodiment of the present disclosure may provide for a method of manufacturing a semiconductor device. The method includes forming a first stack, wherein the first stack includes first material layers and second material layers that are alternately stacked, and forming a second stack on the first stack, wherein the second stack includes at least one third material layer and at least one fourth material layer. The method further includes forming a hole that passes through the first stack and through the second stack, forming a first layer along a sidewall of the hole, filling a central region of the hole passing through the second stack by removing a portion of the insulating material, opening a portion of the hole passing through the second stack by removing a portion of the insulating material, and forming a second layer along a surface defined by the open portion of the hole. Each of the first layer and the second layer is formed of a first semiconductor layer. The method additionally includes forming a second semiconductor layer along a surface of the second layer, wherein the second semiconductor layer is formed of semiconductor material that is different from semiconductor material from which the first semiconductor layer is formed. The method also includes forming a doped semiconductor layer on the second semiconductor layer such that the doped semiconductor layer is spaced from the first semiconductor layer by the second semiconductor layer disposed between the doped semiconductor layer and the first semiconductor layer, wherein the doped semiconductor layer is doped with first conductivity type impurities.

BRIEF DESCRIPTION OF THE DRAWINGS

FIGS. 2A and 2B show sectional views illustrating a semiconductor device according to embodiments of the present disclosure.

FIGS. 4A to 4D show sectional views illustrating a method of manufacturing a semiconductor device according to an embodiment of the present disclosure.

DETAILED DESCRIPTION

Figure 1:
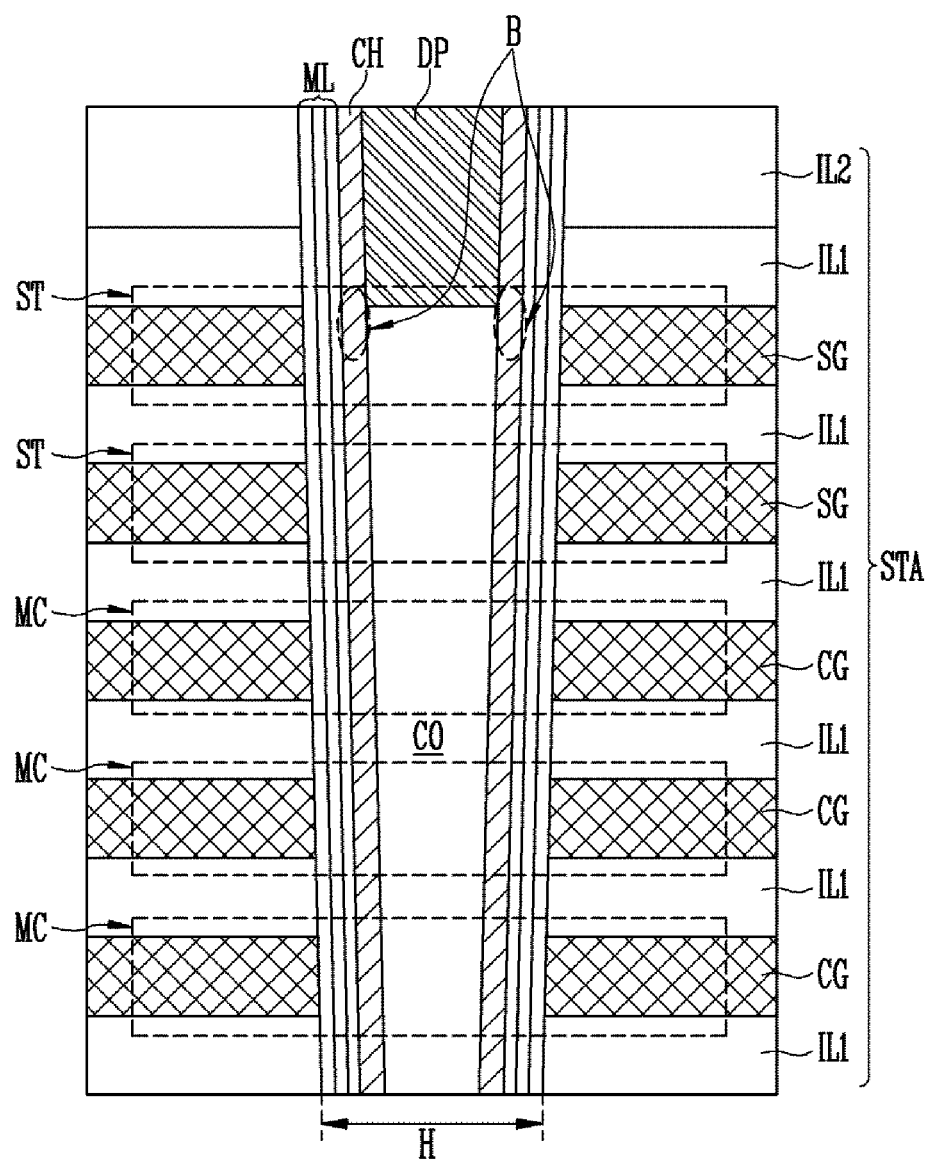
FIG. 1 shows a sectional view illustrating a memory string to explain an erase operation of a three-dimensional semiconductor device using a gate induced drain leakage (GIDL) mechanism.

Example embodiments will now be described more fully hereinafter with reference to the accompanying drawings; however, they may be embodied in different forms and should not be construed as being limited to the embodiments set forth herein. Rather, these embodiments are provided to aid in the description of the present teachings and to convey the description to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly connecting another component but also indirectly coupling to another component through an intermediate component. On the other hand, "directly connected/directly coupled" refers to one component directly connecting to another component without an intermediate component.

Various embodiments of the present disclosure are directed to a semiconductor device having improved erase operation characteristics and a method of manufacturing the same.

In accordance with teachings of the present disclosure is a semiconductor device including a doped semiconductor layer doped with first conductivity type impurities. The semiconductor device also includes a channel pattern including a first semiconductor region and a second semiconductor region. The first semiconductor region encloses a sidewall of the doped semiconductor layer. The second semiconductor region is disposed between the first semiconductor region and the doped semiconductor layer. Also, the second semiconductor region is formed of semiconductor material that is different from semiconductor material from which the first semiconductor region is formed. The semiconductor device additionally includes a first select gate. The first select gate encloses a portion of the first semiconductor region overlapping the second semiconductor region.

The doped semiconductor layer comprises an n-type doped silicon layer. An energy band gap of the second semiconductor region is less than an energy band gap of the first semiconductor region. The first semiconductor region is formed of a silicon layer and the second semiconductor region is formed of a germanium layer. The first conductivity type impurities are distributed in each of the first and second semiconductor regions that are disposed adjacent to the doped semiconductor layer.

The first semiconductor region is defined by first semiconductor layers patterned with a first pattern and a second pattern, the second pattern extends along the sidewall and along a bottom of the doped semiconductor layer, and the first pattern encloses a core insulating layer disposed below the second pattern. In one instance, the second pattern is thinner than the first pattern. In another instance, the first pattern extends along a sidewall of the second pattern to enclose the sidewall of the doped semiconductor layer.

The second semiconductor region of the semiconductor device is defined by a second semiconductor layer that extends along the sidewall and along a bottom of the doped semiconductor layer. The semiconductor device also includes cell gates stacked below the first select gate, wherein the cell gates are spaced apart from each other, and wherein the first semiconductor region is defined by first semiconductor layers passing through the first select gate and the cell gates. The semiconductor device additionally includes a second select gate disposed between the cell gates and the first select gate, wherein the first semiconductor region passes through the second select gate, and wherein the second select gate is disposed at a level level lower than that of the second semiconductor region. The first select gate extends farther than the second semiconductor region toward the cell gates.

Also in accordance with teachings of the present disclosure is a method of manufacturing a semiconductor device. The method includes forming a first stack, wherein the first stack includes first material layers and second material layers that are alternately stacked, and forming a second stack on the first stack, wherein the second stack includes at least one third material layer and at least one fourth material layer. The method further includes forming a hole that passes through the first stack and through the second stack, forming a first layer along a sidewall of the hole, filling a central region of the hole passing through the second stack by removing a portion of the insulating material, opening a portion of the hole passing through the second stack by removing a portion of the insulating material, and forming a second layer along a surface defined by the open portion of the hole. Each of the first layer and the second layer is formed of a first semiconductor layer. The method additionally includes forming a second semiconductor layer along a surface of the second layer, wherein the second semiconductor layer is formed of semiconductor material that is different from semiconductor material from which the first semiconductor layer is formed. The method also includes forming a doped semiconductor layer on the second semiconductor layer such that the doped semiconductor layer is spaced from the first semiconductor layer by the second semiconductor layer disposed between the doped semiconductor layer and the first semiconductor layer wherein the doped semiconductor layer is doped with first conductivity type impurities.

An energy band gap of the second semiconductor layer is less than an energy band gap of the first semiconductor layer. The first semiconductor layer includes a silicon layer, and the second semiconductor layer includes a germanium layer.

The method additionally includes etching a portion of the first layer exposed by removing the insulating material before the forming of the second layer.

The method also includes diffusing the first conductivity type impurities into the second semiconductor layer and into a portion of the second layer surrounding the second semiconductor layer. The first conductivity type impurities comprise an n-type dopant. The first and the at least one third material layers define regions in which insulating layers are disposed, the second material layers define regions in which cell gates are disposed, and the at least one fourth material layer defines a region in which a select gate is disposed. Further, at least one fourth material layer surrounds a portion of a sidewall of the first layer, a portion of a sidewall of the second layer and a portion of a sidewall of the second semiconductor layer.

Doping a semiconductor with impurities, as used herein, means that the semiconductor can be doped with only a single dopant (e.g., a single element) or the semiconductor can be doped with multiple dopants (e.g., two or more elements).

The word "region," as used herein, can refer to an area or a volume of space. The word region can also refer to structure occupying the volume or space. For example, a first semiconductor region can refer to at least one first semiconductor layer that occupies and defines the extent of the first semiconductor region. Similarly, a second semiconductor region can refer to a second semiconductor layer that occupies and defines the extent of the second semiconductor region.

The word "encloses," as used herein, can mean to encircle in two dimensions or to bound and/or surround on multiple sides in one-, two-, or three-dimensional space.

The word adjacent, as used herein, can mean adjoin or in close proximity. For example, both first and second semiconductor regions can be adjacent to a doped semiconductor layer when the second semiconductor region, in contact with doped semiconductor layer, separates the first semiconductor region from the doped semiconductor layer.

FIG. 1 shows a sectional view illustrating a memory string to explain an erase operation of a three-dimensional semiconductor device using a gate induced drain leakage (GIDL) mechanism.

Referring to FIG. 1, the three-dimensional semiconductor device may include a stack STA, a channel pattern CH disposed in a hole H passing through the stack STA, a multilayer memory pattern ML enclosing the channel pattern CH, and a doped semiconductor layer DP overlapping the channel pattern CH.

The stack STA may include conductive patterns CG and SG and insulating layers IL1 and IL2 that are alternately stacked in a first direction, as shown in FIG. 1.

The conductive patterns CG and SG may include cell gates CG and at least one select gate SG. The cell gates CG that are stacked may be spaced apart from each other in the first direction. Each of the cell gates CG is used as a gate of a memory cell transistor. The select gate SG is disposed over the cell gates CG. The select gate SG is used a gate of a select transistor.

The insulating layers IL1 and IL2 may be divided into first insulating layers IL1 and a second insulating layer IL2. The first insulating layers IL1 may be disposed on or under the respective conductive patterns CG and SG. In other words, the first insulating layers IL1 and the conductive patterns CG and SG may be alternately disposed in the first direction. The second insulating layer IL2 may be disposed on the alternating structure of the first insulating layers IL1 and the conductive patterns CG and SG.

The multilayer memory pattern ML may include a data storage layer configured to store data and may be formed on a sidewall of the hole H. The channel pattern CH may be a body of a memory string including the select transistor and the cell transistors and may function as a channel.

The doped semiconductor layer DP may be used as a source region or a drain region. The doped semiconductor layer DP may overlap a portion of the select gate SG. A central region of the hole H which is defined by the channel pattern CH under the doped semiconductor layer DP may be filled with a core insulating layer CO.

The three-dimensional semiconductor device may include a select transistor ST, which is defined by an intersection between the select gate SG and the channel pattern CH, and a memory cell transistor MC, which is defined by an intersection between the cell gate CG and the channel pattern CH. An erase operation may be performed by inducing a tunneling phenomenon between bands and generating GIDL current. In more detail, the erase operation may be performed by applying a high voltage to the doped semiconductor layer DP. A depletion region is formed between the doped semiconductor layer DP and the select gate SG disposed adjacent to the doped semiconductor DP. The tunneling phenomenon between bands is caused by a high electric field generated in the depletion region, whereby GIDL current flows. A region in which the GIDL current is generated is designated by reference character B. A large amount of electron-hole pairs are generated by GIDL, and the generated holes are supplied to the channel pattern CH, whereby the potential of the channel pattern CH may be boosted. The holes supplied to the channel pattern CH are coupled to electrons that have been trapped in the memory cell transistor MC, whereby an erase operation of the memory cell transistor MC may be performed.

To improve efficiency of the erase operation, the voltage applied to the doped semiconductor layer DP may be increased such that a high electric field is applied between the doped semiconductor layer DP and the select gate SG. In this case, holes are injected into the select gate SG so that the threshold voltage of the select transistor ST may change. Deterioration in characteristics of the select transistor ST may be exacerbated as the number of iterations of an erase operation and a program operation is increased. Variation in the threshold voltage of the select transistor ST may cause failures such as data disturbance, deterioration in data retention characteristics, and an increase in the number of bad blocks. Therefore, embodiments of the present disclosure provide a method for increasing the efficiency of an erase operation by reducing a voltage to be applied to the select gate SG. Hereinafter, embodiments of the present disclosure will be described in more detail with reference to the remaining drawings.

Figure 2B:
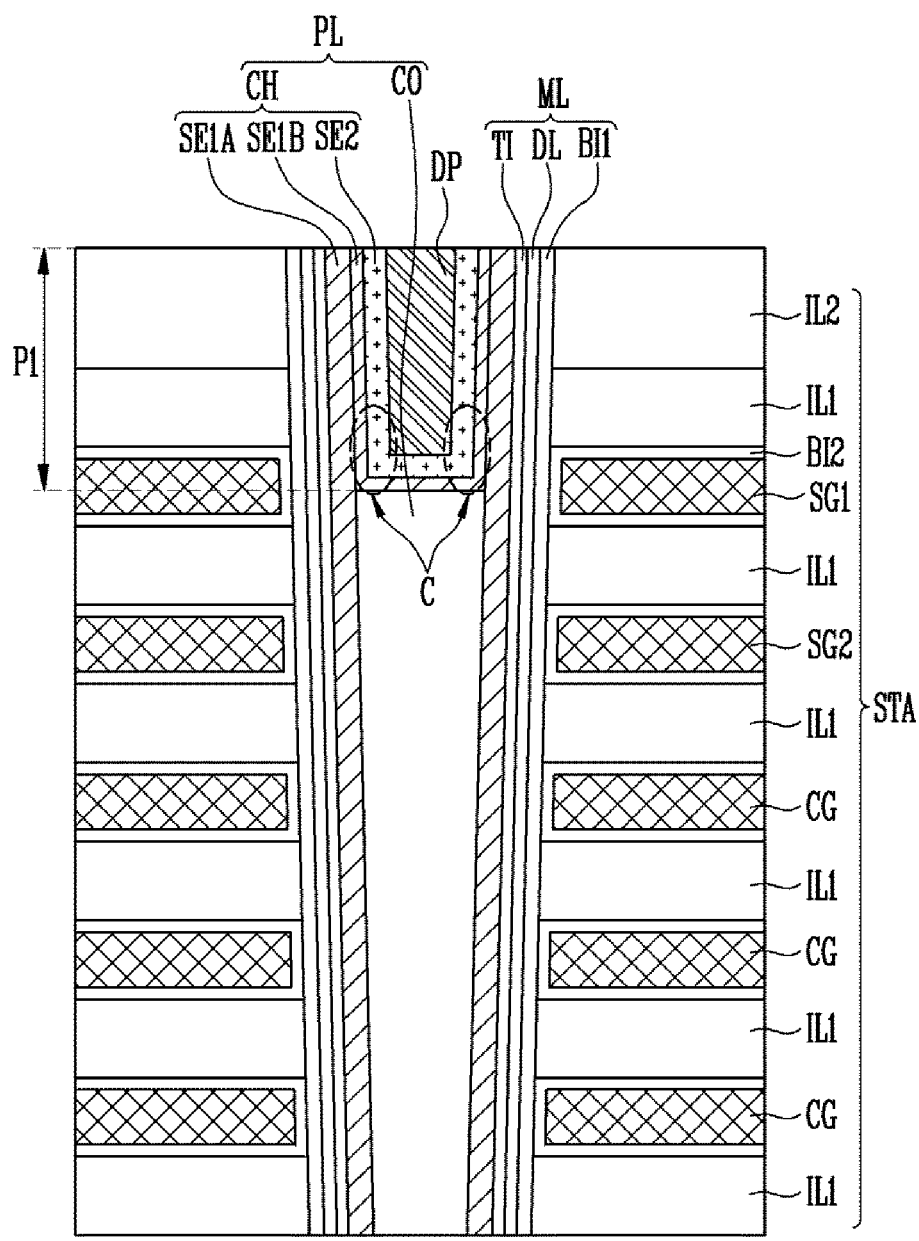

FIGS. 2A and 2B show sectional views illustrating a semiconductor device according to some embodiments of the present disclosure. More specifically, FIGS. 2A and 2B show sectional views illustrating a three-dimensional memory string.

Referring to FIGS. 2A and 2B, the semiconductor device may include a pillar PL. The semiconductor device may further include conductive patterns CG, SG1, and SG2 and insulating layers IL1 and IL2 which enclose the pillar PL and are stacked in a direction in which the pillar PL extends.

An outer surface of the pillar PL may be enclosed by a multilayer memory pattern ML. The multilayer memory pattern ML may be disposed between the conductive patterns CG, SG1, and SG2 and the pillar PL.

The pillar PL may include a doped semiconductor layer DP, which is used as a source or a drain, and a channel pattern CH, which comes into contact with the doped semiconductor layer DP and functions as a channel. The pillar PL may further include a core insulating layer CO.

The doped semiconductor layer DP may be a semiconductor layer doped with a first conductivity type impurity. The first conductivity type impurity may be an n-type dopant. The doped semiconductor layer DP may be an n-type doped silicon layer. As will be described later with reference to FIGS. 3A to 3C, the doped semiconductor layer DP may be electrically coupled to a bit line or a source line.

The core insulating layer CO is enclosed by the channel pattern CH and is disposed below the doped semiconductor layer DP. The core insulating layer CO may include an oxide.

The channel pattern CH may include at least one of first semiconductor layers SE1A and SE1B, and a second semiconductor layer SE2, which is formed of semiconductor material different from that of the first semiconductor layers SE1A and SE1B. A first semiconductor region is defined along each of the first semiconductor layers SE1A and SE1B, and a second semiconductor region is defined along the second semiconductor layer SE2. According to this structure, the channel pattern CH, in accordance with an embodiment of the present disclosure, may include a first semiconductor region and a second semiconductor region that are formed of different semiconductor materials. The second semiconductor layer SE2 is disposed to overlap at least one of the first semiconductor layers SE1A and SE1B. Consequently, a first region P1 is defined by a height by which the first semiconductor region and the second semiconductor region that differ from each other overlap each other. The first region P1 may be defined by a height by the second semiconductor layer SE2.

First conductivity type impurities diffused from the doped semiconductor layer DP may be distributed in portions of the first semiconductor layers SE1A and SE1B between the second semiconductor layer SE2 and the multilayer memory pattern ML and may be distributed in the second semiconductor layer SE2 that is adjacent to the doped semiconductor layer DP. In other words, n-type impurities may be distributed in the first semiconductor region and the second semiconductor region that surround the doped semiconductor layer DP.

The tunneling, which induces GIDL current, is increased as an energy band gap (Eg) of material that forms a depletion region is reduced. In an embodiment of the present disclosure, to increase GIDL current with the above-mentioned characteristics, the second semiconductor layer SE2 is made of material having an energy band gap different from that of the first semiconductor layers SE1A and SE1B. In more detail, materials which form the first semiconductor layers SE1A and SE1B and the second semiconductor layer SE2 may be selected such that the second semiconductor region has an energy band gap less than that of the first semiconductor region. For example, the first semiconductor layers SE1A and SE1B may be formed of silicon layers, and the second semiconductor layer SE2 may be formed of a germanium layer. The germanium layer has an energy band gap of 0.67 electron volts (eV) which is less than a 1.12 eV energy band gap of the silicon layer.

Because the second semiconductor layer SE2 is formed of a material having an energy band gap less than that of the first semiconductor layers SE1A and SE1B, GIDL current generated in region C may be increased even though a voltage applied to the doped semiconductor layer DP is not excessively increased. To deposit the germanium layer, the silicon layer may be used as a seed layer. The first semiconductor layers SE1A and SE1B and the second semiconductor layer SE2 may have various shapes.

For example, the first semiconductor layers that form the first semiconductor region may be divided into a first pattern SE1A and a second pattern SE1B that are deposited by different processes.

Referring to FIG. 2A, the first pattern SE1A may be disposed under the second pattern SE1B and enclose the sidewall of the core insulating layer CO. The second pattern SE1B may extend along the sidewall and the bottom of the doped semiconductor layer DP. The second pattern SE1B may function as a seed layer for the second semiconductor layer SE2. The second pattern SE1B may be formed as thin as possible such that space in which the second semiconductor layer SE2 and the doped semiconductor layer DP are to be disposed is prevented from being excessively reduced by the second pattern SE1B. Consequently, a second thickness D2 of the second pattern SE1B may be less than a first thickness D1 of the first pattern SE1A. For example, the second pattern SE1B may have a thickness ranging from 5 angstroms (Å) to 30 Å.

The second semiconductor layer SE2 is disposed between the second pattern SE1B and the doped semiconductor layer DP. In other words, the second semiconductor layer SE2 extends along the sidewall and the bottom of the doped semiconductor layer DP. A GIDL region C may be formed both in the second pattern SE1B that defines the first semiconductor region and in the second semiconductor layer SE2 that defines the second semiconductor region.

Referring to FIG. 2B, the first pattern SE1A may extend to enclose the sidewalls of the second semiconductor layer SE2 and the doped semiconductor layer DP along the sidewall of the second pattern SE1B.

Referring to FIGS. 2A and 2B, a deposition thickness of the second semiconductor layer SE2 may be set taking into account the size of the GIDL region C, which is formed during an erase operation of the semiconductor device. For example, the deposition thickness of the second semiconductor layer SE2 may be formed according to the area of the GIDL region C required for an erase operation.

The conductive patterns CG, SG1, and SG2 are penetrated by the pillar PL. As described for FIG. 1, the conductive patterns CG, SG1, and SG2 may include cell gates CG and at least one select gate (at least one of SG1 and SG2). Although the drawings illustrate the first and second select gates SG1 and SG2, embodiments in accordance with the present teachings are not limited to this arrangement. For example, a layer for forming the second select gate SG2 may be omitted. Alternatively, a third select gate (not shown) may be further disposed between the second select gate SG2 and the cell gates CG.

The first select gate SG1 is a conductive pattern disposed in an uppermost layer, and at least a portion thereof is disposed to enclose the first region P1. More specifically, the first semiconductor region passes through the first select gate SG1 and the second semiconductor region passes through a portion of the first select gate SG1. The cell gates CG are stacked below the first and second select gates SG1 and SG2 and spaced apart from each other. The first select gate SG1 may protrude further than the first region P1 toward the cell gates CG. In other words, the first select gate SG1 extends farther than the semiconductor region or the second semiconductor layer SE2 toward the cell gates CG.

The second select gate SG2 may be disposed between the first select gate SG1 and the cell gates CG. The second select gate SG2 may enclose a portion of the first pattern SE1A that defines the first semiconductor region below the first region P1. In other words, the first semiconductor region passes through the second select gate SG2 and the second select gate SG2 is disposed at level lower than that of the second semiconductor region or the second semiconductor layer SE2.

Each of the conductive patterns CG, SG1, and SG2 may be formed of various conductive materials. Each of the conductive patterns CG, SG1, and SG2 may be formed of a single conductive material or two or more conductive materials. Each of the conductive patterns CG, SG1, and SG2 may include at least one of doped polysilicon, metal silicide, a metal layer, and a barrier metal layer. Low-resistance metal may be used as the material of a metal layer for the conductive patterns CG, SG1, and SG2. For example, the low-resistance metal may include tungsten.

As described for FIG. 1, the insulating layers IL1 and IL2 may be divided into the first insulating layers IL1 and the second insulating layer IL2. Each of the insulating layers IL1 and IL2 may be formed of an oxide layer.

The multilayer memory layer ML may include a tunnel insulating layer TI configured to enclose the channel pattern CH, a data storage layer DL configured to enclose the tunnel insulating layer TI, and a first blocking insulating layer BI1 configured to enclose the data storage layer DL. The data storage layer DL may store data changed using Fowler-Nordheim tunneling caused by a voltage difference between the cell gates CG and the channel pattern CH. For this operation, the data storage layer DL may be formed of various materials, for example, a nitride layer capable of trapping charges. In addition, the data storage layer DL may include silicon, phase-change material, nanodots, etc. The first blocking insulating layer BI1 may include an oxide layer capable of blocking charges. The tunnel insulating layer TI may be formed of a silicon oxide layer making charge tunneling possible.

The first semiconductor layer SE1B having a relatively large energy band gap is disposed closer to the select gates SG1 and SG2 than is the second semiconductor layer SE2 having a relatively small energy band gap. GIDL current for an erase operation may be increased by the second semiconductor layer SE2. The first semiconductor layer SE1B having a relatively large energy band gap may reduce leakage current around the select transistor during a program operation of the semiconductor device. If leakage current is reduced using the first semiconductor layer SE1B having a large energy band gap, then boosting efficiency of the cell string may be improved and disturbance characteristics may be mitigated.

Referring to FIG. 2B, the semiconductor device may further include a second blocking insulating layer BI2. The second blocking insulating layer BI2 may be formed of material different from that of the first blocking insulating layer BI1. The second blocking insulating layer BI2 may be formed of insulating material having a dielectric constant greater than that of the first blocking insulating layer BI1. For example, the first blocking insulating layer BI1 may be formed of a silicon oxide layer, and the second blocking insulating layer BI2 may be formed of a metal oxide. Aluminum oxide $Al_2O_3$ may be used as a metal oxide for the second blocking insulating layer BI2. The second blocking insulating layer BI2 may extend along interfaces between the first insulating layers IL1 and the conductive patterns CG, SG1, and SG2, and the interfaces between the conductive patterns CG, SG1, and SG2 and the multilayer memory pattern ML. The second blocking insulating layer BI2 may also be applied to the structure shown in FIG. 2A.

Referring to FIGS. 2A and 2B, according to an embodiment of the present disclosure, the GIDL region C is defined in two semiconductor regions including the first semiconductor layer SE1B and the second semiconductor layer SE2 that are formed different semiconductor materials. Particularly, the second semiconductor layer SE2 that defines the second semiconductor region is formed of semiconductor material having an energy band gap less than that of the first semiconductor layer SE1B. Consequently, during an erase operation, according to an embodiment of the present disclosure, even when a relatively low voltage is applied between the first select gate SG1 and the doped semiconductor layer DP, GIDL current may be easily generated through the second semiconductor layer SE2 having a small energy band gap. As a result, because efficiency of generating holes can be increased even at low bias, the erase speed may be enhanced, and erase operation characteristics may be improved.

In an embodiment of the present disclosure, because the erase efficiency of the memory cell transistor at a low erase voltage may be increased, deterioration in the reliability of the memory cell transistor due to repetition of an erase operation and a read operation of the memory cell transistor may be reduced.

In addition, in an embodiment of the present disclosure, because a voltage for generating GIDL current may be reduced, high voltage stress otherwise applied to the select transistor during the erase operation may be reduced, whereby deterioration in characteristics of the select transistor may be mitigated. In other words, because a sufficient amount of holes for the erase operation may be generated even when an electric field between the doped semiconductor layer DP and the first select gate SG1 is not increased, a phenomenon in which holes are injected into the first select gate SG1 by a high electric field may be reduced. Consequently, in an embodiment, variation in the threshold voltage of the select transistor may be mitigated, and failures such as data disturbance, deterioration in data retention characteristics, and an increase in the number of bad blocks by variation in the threshold voltage of the select transistor may be reduced.

For various embodiments, the GIDL region C is not limited to the region shown in FIGS. 2A and 2B and can be defined as having various ranges depending on the design of the semiconductor device. For example, the depth of the GIDL region C may extend to a portion of the channel pattern CH that encloses the second select gate SG2. Alternatively, the depth of the GIDL region C may extend into a portion of the channel pattern CH that is disposed below the second select gate SG2. Although not shown in the drawings, a third select gate may be further disposed between the second select gate SG2 and the cell gates CG. In this case, the depth of the GIDL region C may extend into a portion of the channel pattern CH that is disposed below the third select gate (not shown).

Figure 3A:
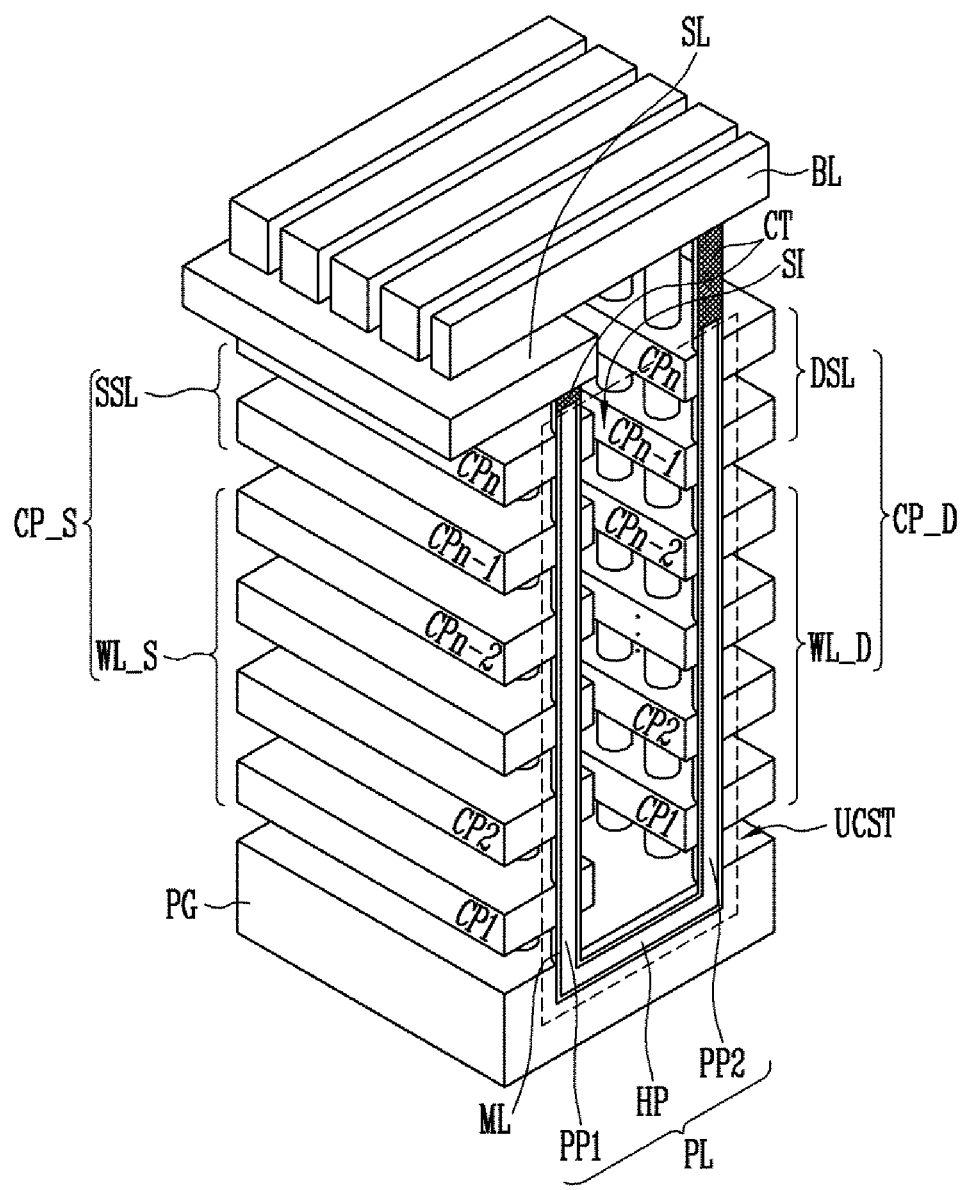
FIGS. 3A to 3C show perspective views illustrating the structure of a memory string for the semiconductor device shown in FIGS. 2A and 2B.
Figure 3B:
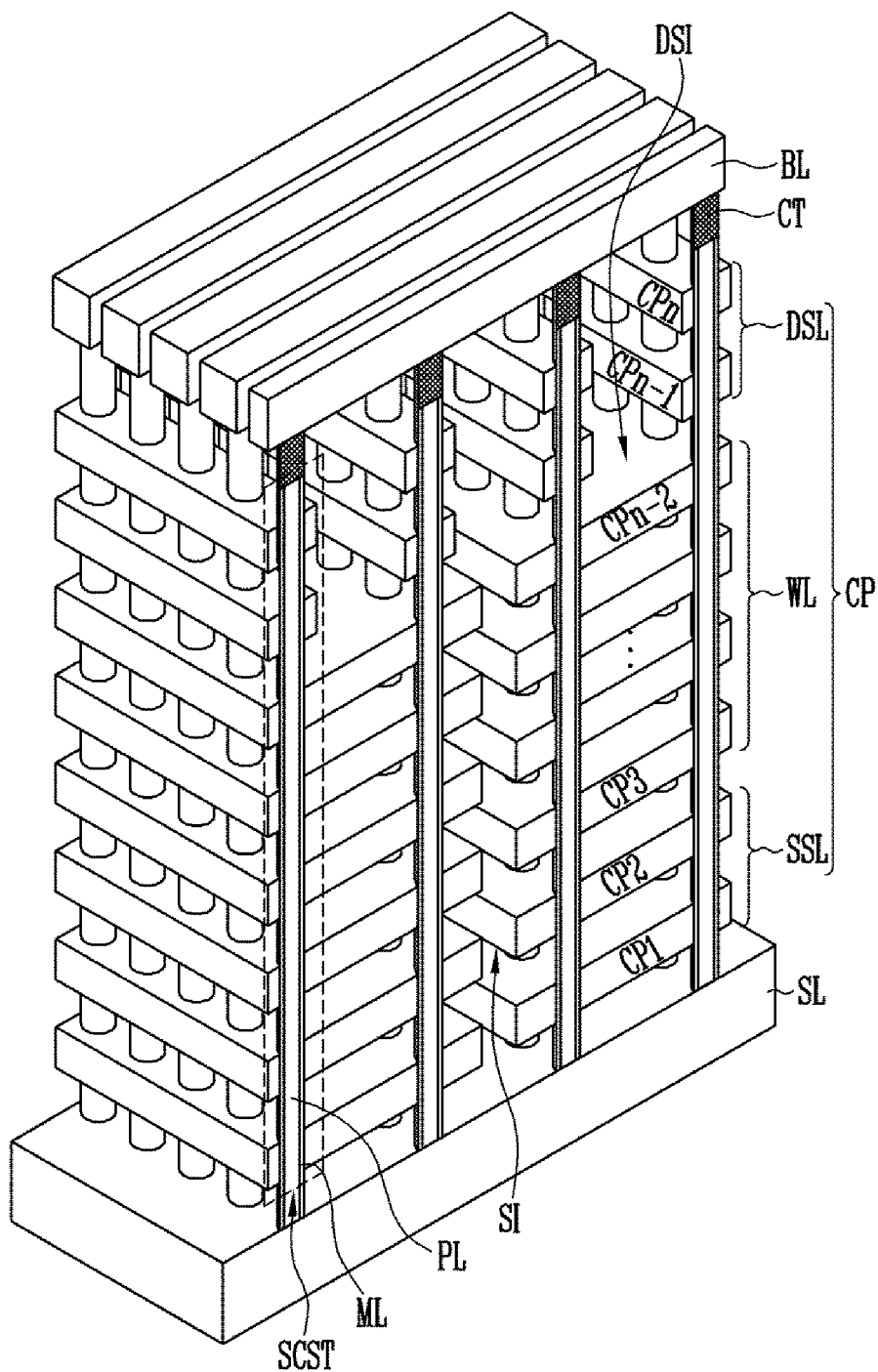
Figure 3C:
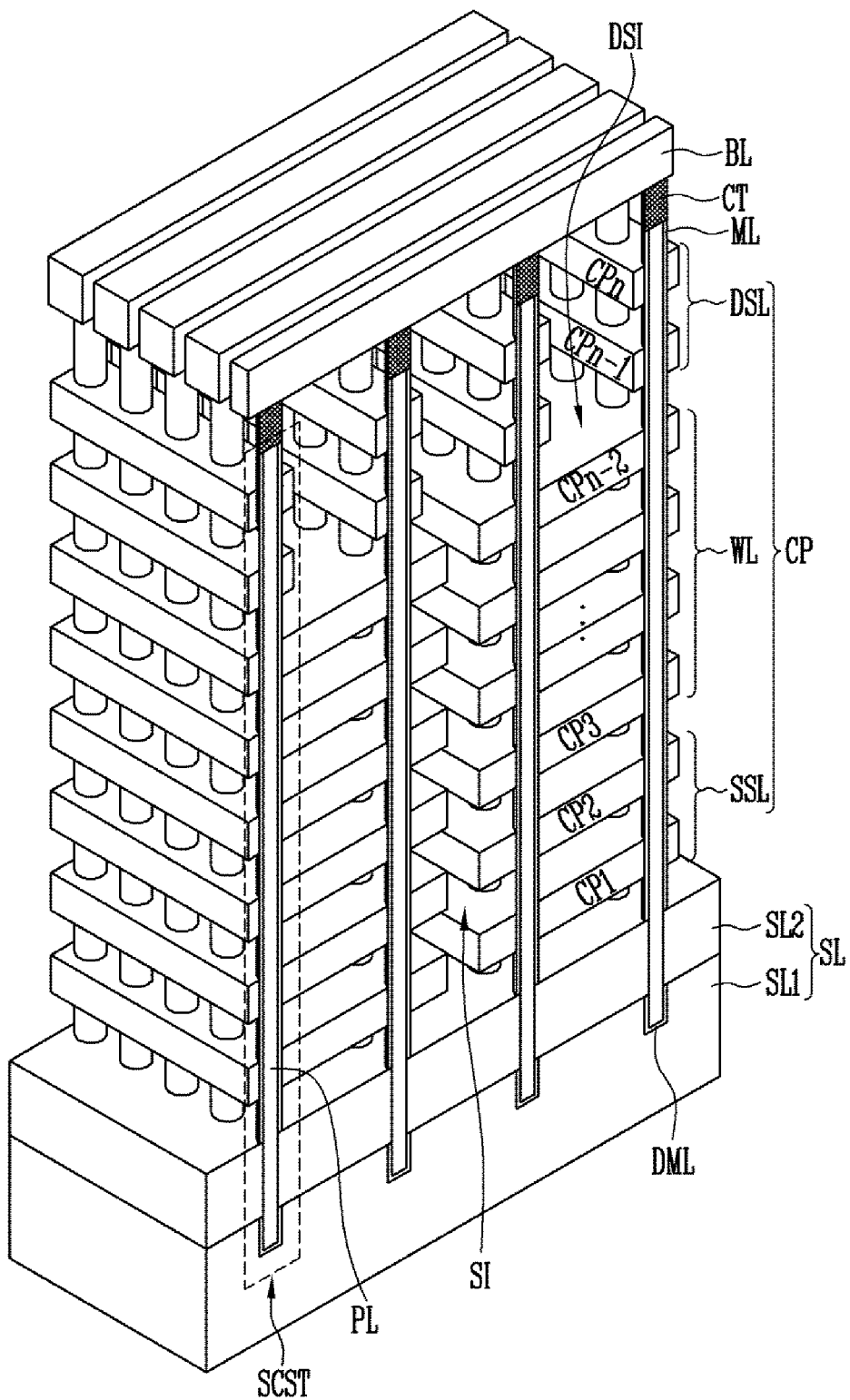

FIGS. 3A to 3C show perspective views illustrating the structure of a memory string to which embodiments shown in FIGS. 2A and 2B may be applied. However, embodiments of the present disclosure are not limited to the embodiments illustrated in FIGS. 3A to 3C and may correspond to various structures of the semiconductor device. For the sake of clarity, insulating layers are not shown in FIGS. 3A to 3C. In FIGS. 3A to 3C, a pillar PL is shown in a schematic form. A first semiconductor layer, a second semiconductor layer, a doped semiconductor layer, and a core insulating layer that form the pillar PL are not shown in detail. The first semiconductor layer, the second semiconductor layer, the doped semiconductor layer, and the core insulating layer that form the pillar PL shown in FIGS. 3A to 3C are formed in accordance with the structure described in FIG. 2A or 2B. Therefore, a detailed configuration of the pillar PL will be described with reference to FIG. 2A or 2B.

FIG. 3A shows a perspective view illustrating a U-shaped memory string UCST having a three-dimensional structure.

Referring to FIG. 3A, the U-shaped memory string UCST may include memory cell transistors, a pipe transistor, and select transistors that are arranged along a U-shaped pillar PL. Cell gates of the memory cell transistors and select gates of the select transistors may be coupled to conductive patterns CP1 to CPn.

The pillar PL may include a horizontal part HP embedded in a pipe gate PG and a first vertical part PP1 and a second vertical part PP2 extending from the horizontal part HP. Each of the first and second vertical parts PP1 and PP2 corresponds to the structure of the pillar PL described with reference to FIG. 2A or 2B. In detail, each of the first and second vertical parts PP1 and PP2 may have a structure including the first semiconductor layer, the second semiconductor layer, the doped semiconductor layer, and the core insulating layer that are described in FIG. 2A or 2B. The horizontal part HP may include a core insulating layer and a first semiconductor layer that extend through the pipe gate PG from each of the first and second vertical parts PP1 and PP2.

The pillar PL may be electrically coupled between a source line SL and a bit line BL. The bit line BL and the source line SL are disposed in different layers and spaced apart from each other. For example, the source line SL may be disposed below the bit line BL. The source line SL may be electrically coupled to an upper end of the first vertical part PP1. The bit line BL may be electrically coupled to an upper end of the second vertical part PP2. The bit line BL may extend in a direction perpendicular or nonparallel the source line SL. Contact plugs CT may be disposed between the source line SL and the first vertical part PP1 and between the bit line BL and the second vertical part PP2. The contact plugs CT may come into contact with the doped semiconductor layers of the pillar PL.

The conductive patterns CP1 to CPn may be disposed in n layers spaced apart from each other below the bit line BL and the source line SL. The conductive patterns CP1 to CPn may include source side conductive patterns CP_S and drain side conductive patterns CP_D.

The source side conductive patterns CP_S may enclose the first vertical part PP1 and may be stacked to be spaced apart from each other. The source side conductive patterns CP_S may include source side word lines WL_S and a source select line SSL. The source select line SSL may be disposed over the source side word lines WL_S. The source select line SSL may be disposed to have a single-layered or a two or more layered structure over the source side word lines WL_S. Although the drawing illustrates an example in which the source select line SSL is configured with an n-th pattern CPn that is disposed in an uppermost layer of the source side conductive patterns CP_S and an n−1-th pattern CPn−1 disposed below the n-th pattern CPn, other embodiments are not limited to this arrangement.

The drain side conductive patterns CP_D may enclose the second vertical part PP2 and be stacked to be spaced apart from each other. The drain side conductive patterns CP_D may include drain side word lines WL_D and a drain select line DSL. The drain select line DSL may be disposed over the drain side word lines WL_D. The drain select line DSL may have a single-layered or a two or more layered structure over the drain side word lines WL_D. Although the drawing illustrates an example in which the drain select line DSL is configured with an n-th pattern CPn that is disposed in an uppermost layer of the drain side conductive patterns CP_D and with an n−1-th pattern CPn−1 disposed below the n-th pattern CPn, other embodiments are not limited to this arrangement.

The source side conductive patterns CP_S and the drain side conductive patterns CP_D may be separated from each other with a slit SI formed therebetween.

The pipe gate PG is disposed below the source side conductive patterns CP_S and the drain side conductive patterns CP_D and is formed to enclose the horizontal part HP. The pipe gate PG may be disposed below the conductive patterns CP1 to CPn.

An outer surface of the pillar PL may be enclosed by a multilayer memory pattern ML. As described for FIGS. 2A and 2B, the multilayer memory pattern ML may include a tunnel insulating layer, a data storage layer, and a blocking insulating layer.

The first select gate and the second select gate described with reference to FIG. 2A or 2B correspond to the source select lines SSL or drain select lines DSL shown in FIG. 3A. The cell gates described with reference to FIG. 2A or 2B correspond to the source side word lines WL_S or the drain side word lines WL_D shown in FIG. 3A.

The source side memory cell transistors are formed at intersections between the first vertical part PP1 and the source side word lines WL_S. The drain side memory cell transistors are formed at intersections between the second vertical part PP2 and the drain side word lines WL_D. The source select transistor is formed at an intersection between the first vertical part PP1 and the source select line SSL. A drain select transistor is formed at an intersection between the second vertical part PP2 and the drain select line DSL. The pipe transistor is formed at an intersection between the horizontal part HP and the pipe gate PG. The source select transistor, the source side memory cell transistors, the pipe transistor, the drain side memory cell transistors, and the drain select transistor that are arranged along the single pillar PL may be coupled in series through the first and second semiconductor layers that form a channel pattern of the pillar PL. The source select transistor, the source side memory cell transistors, the pipe transistor, the drain side memory cell transistors, and the drain select transistor that are coupled in series along the U-shaped pillar PL may define the U-shaped memory string UCST.

The pillar PL may have various shapes in different embodiments, including not only the above-mentioned "U" shape but also a "W" shape, and other shapes. The memory string structure may be changed in various forms depending on the extension structure of the pillar PL.

FIGS. 3B and 3C show perspective views illustrating a straight type memory string SCST having a three-dimensional structure.

Referring to FIGS. 3B and 3C, the straight type memory string SCST may include memory cell transistors and select transistors which are stacked along a straight type pillar PL.

Cell gates of the memory cell transistors and select gates of the select transistors may be coupled to the conductive patterns CP1 to CPn.

The pillar PL may include the same structure as that of the pillar described with reference to FIG. 2A or 2B. In detail, the pillar PL may be formed of a structure including the first semiconductor layer, the second semiconductor layer, the doped semiconductor layer, and the core insulating layer which are described with reference to FIG. 2A or 2B.

The doped semiconductor layer of the pillar PL may be electrically coupled to a bit line BL. For this, the doped semiconductor layer of the pillar PL may be directly coupled to the bit line BL. Alternatively, a contact plug CT may be formed between the bit line BL and the pillar PL.

A lower end of the pillar PL may be coupled to the source line SL. The source line SL may be formed to have various structures.

As shown in FIG. 3B, the source line SL may come into contact with the bottom of the pillar PL. In more detail, the source line SL may come into contact with the bottom of the first semiconductor layer of the pillar PL. The source line SL may include a doped polysilicon layer including a first conductivity type impurity. The pillar PL may come into contact with an upper surface of the source line SL and extend toward the bit line BL.

An outer surface of the pillar PL shown in FIG. 3B may be enclosed by a multilayer memory pattern ML. As described for FIGS. 2A and 2B, the multilayer memory pattern ML may include a tunnel insulating layer, a data storage layer, and a blocking insulating layer.

As shown in FIG. 3C, a portion of the lower end of the pillar PL may extend into the source line SL. In other words, the lower end of the pillar PL may pass through a portion of the source line SL.

In more detail, the source line SL may have a stacked structure including a first source layer SL1 and a second source layer SL2. The first source layer SL1 may enclose the lower end of the pillar PL. The second source layer SL2 may be disposed over the first source layer SL1 and be brought into contact with an upper surface of the first source layer SL1 and the sidewall of the pillar PL. The second source layer SL2 may enclose the pillar PL. As illustrated, the pillar PL passes through the second source layer SL2 and terminates within the first source layer SL1.

An outer surface of the pillar PL shown in FIG. 3C may be enclosed by the multilayer memory pattern ML as described for FIG. 2A or 2B. The pillar PL may protrude further than the multilayer memory pattern ML toward the source line SL. A dummy memory pattern DML may remain between the pillar PL and the first source layer SL1 and may function as an insulating layer. The dummy memory pattern DML may be formed of the same material layers as that of the multilayer memory pattern ML. The pillar PL disposed between the multilayer memory pattern ML and the dummy memory pattern DML may be brought into direct contact with the second source layer SL2.

Referring to FIGS. 3B and 3C, the conductive patterns CP1 to CPn may be disposed in n layers spaced apart from each other between the bit line BL and the source line SL. The conductive patterns CP1 to CPn may enclose the pillar PL and may be stacked to be spaced apart from each other. The conductive patterns CP1 to CPn may include a source select line SSL, word lines WL, and a drain select line DSL. The source select line SSL may be disposed over the source line SL. The word lines WL may be disposed over the source select lines SSL. The drain select line DSL may be disposed over the word lines WL. The conductive patterns CP1 to CPn may be separated into a plurality of stacked structures by the slit SI. A slit, for example, may separate two stacked structures.

The source select line SSL may be disposed to have a single-layered or a two or more layered structure below the word lines WL. Although the drawing illustrates an example in which the source select line SSL is configured with a first pattern CP1 disposed in a lowermost layer of the conductive patterns CP1 to CPn and a second pattern CP2 disposed over the first pattern CP1, other embodiments are not limited to this arrangement.

The drain select line DSL may be disposed to have a single-layered or a two or more layered structure over the word lines WL. Although the drawing illustrates an example in which the drain select line DSL is configured with an n-th pattern CPn disposed in an uppermost layer of the conductive patterns CP1 to CPn and an n−1-th pattern CPn−1 disposed below the n-th pattern CPn, other embodiments are not limited to this arrangement.

The conductive patterns CP1 to CPn may be separated from each other by the slit SI. Either the source select line SSL or the drain select line DSL may be separated into units smaller than the word lines WL. For example, pillars PL that are enclosed in common by each word line WL may be classified into a first group and a second group, and a drain select line enclosing pillars of the first group may be separated from a drain select line enclosing pillars of the second group by a drain separation slit DSI.

According to the configuration described with reference to FIGS. 3B and 3C, memory cell transistors are formed at intersections between each pillar PL and the word lines WL, a drain select transistor is formed at an intersection between each pillar PL and the drain select line DSL, and a source select transistor is formed at an intersection between each pillar PL and the source select line SSL. The source select transistor, the memory cell transistors, and the drain select transistor, which are arranged in a line along each pillar PL, are coupled in series to each other through the pillar PL and thus define a straight type memory string SCST. The word lines WL correspond to the cell gates described for FIG. 2A or 2B, and the drain select line DSL corresponds to the select gate described for FIG. 2A or 2B.

FIGS. 4A to 4D show sectional views illustrating a method of manufacturing a semiconductor device according to an embodiment of the present disclosure. In more detail, FIGS. 4A to 4D show sectional views illustrating an embodiment of a method of manufacturing the semiconductor device shown in FIG. 2A.

Figure 4A:
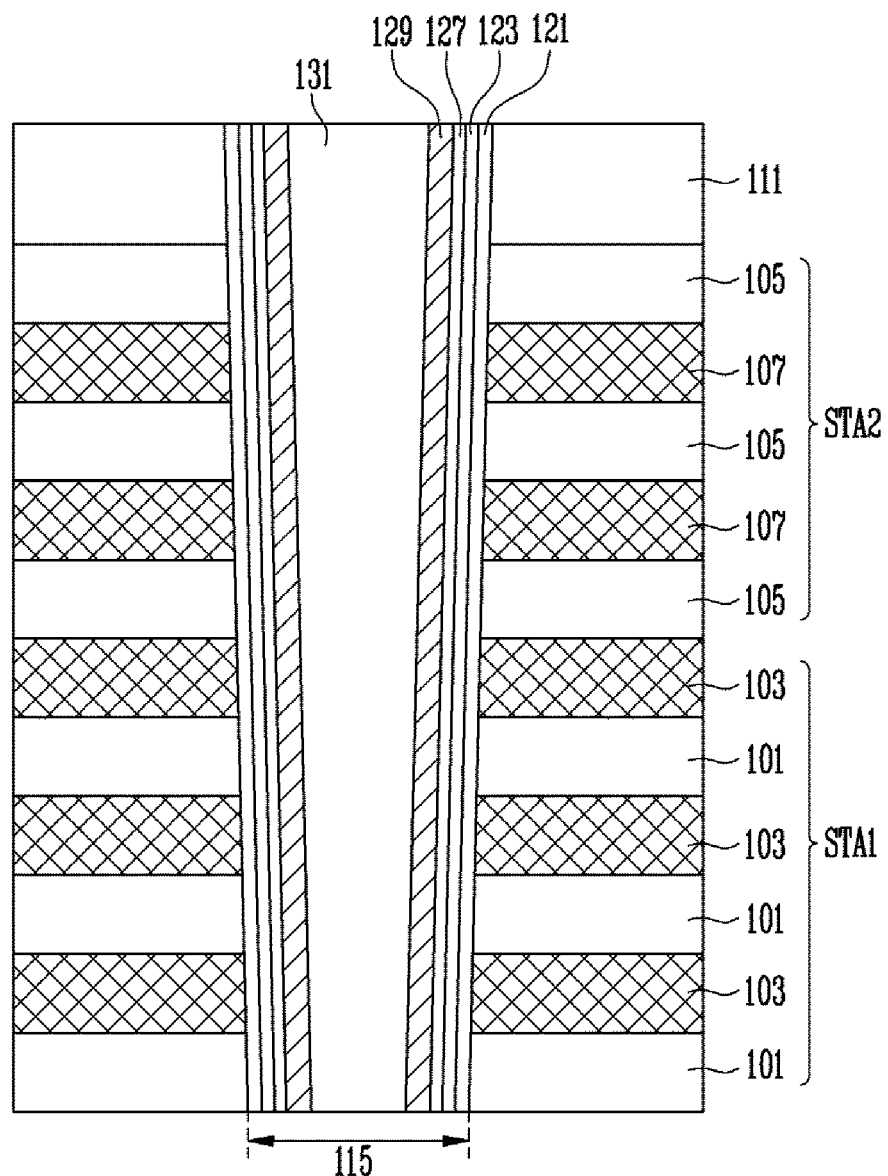

Referring to FIG. 4A, a first stack STA1 and a second stack STA2 are successively formed on a substrate (not shown). Although not shown in the drawings, the first stack STA1 may be formed on a substrate on which a driving circuit is formed. The substrate may further include the pipe gate described for FIG. 3A. In this case, the first stack STA1 may be formed on the pipe gate that includes a pipe trench defining a space in which the horizontal part described for FIG. 3A is disposed. Alternatively, the substrate may further include the source line described for FIG. 3B. In this case, the first stack STA1 may be formed on the source select line after the source select line described for FIG. 3B has been formed on the source line. As a further alternative, the substrate may further include the first source layer described for FIG. 3C. In this case, the first stack STA1 may be formed on a sacrificial source layer after the sacrificial source layer has been formed on the first source layer.

The first stack STA1 may be formed by alternately stacking first material layers 101 and second material layers 103. The first material layers 101 define regions in which insulating layers are disposed, and the second material layers 103 define regions in which cell gates are disposed.

The first material layers 101 may be formed of material different from that of the second material layers 103. In a first case, the first material layers 101 may be formed of insulating material suitable for insulating the cell gates from each other, and the second material layers 103 may be formed of sacrificial insulating material having an etching rate different from that of the first material layers 101. In detail, each first material layer 101 may be formed of a silicon oxide layer, and each second material layer 103 may be formed of a silicon nitride layer. In a second case, the first material layers 101 may be formed of insulating material suitable for insulating the cell gates from each other, and the second material layers 103 may be formed of conductive material suitable for forming the cell gates. In more detail, each second material layer 103 may include at least one of a doped silicon layer, a metal silicide layer, a metal layer, and a barrier metal layer, and each first material layer 101 may be formed of a silicon oxide layer. In a third case, the second material layers 103 may be formed of conductive material suitable for forming the cell gates, and the first material layers 101 may be formed of sacrificial conductive material having an etching rate different from that of the second material layers 103. In more detail, each second material layer 103 may be formed of a doped silicon layer, and each first material layer 101 may be formed of an undoped silicon layer. Although FIGS. 4A to 4D illustrate the second case, embodiments of the present disclosure are not limited to this case.

The second stack STA2 may include at least one third material layer 105 and at least one fourth material layer 107. In other words, the second stack STA2 may include at least one pair of the third material layer 105 and the fourth material layer 107. The third material layer 105 defines a region in which an insulating layer is disposed, and the fourth material layer 107 defines a region in which a select gate is disposed. As illustrated in FIG. 2A, in the case where the semiconductor device includes the first and second select gates, the second stack STA2 may include three third material layers 105 spaced apart from each other, and two fourth material layers 107 spaced apart from each other. The structure of the second stack STA2, according to the present disclosure, is not necessarily limited to this and may be changed in various shapes and/or patterns depending on the number of select gates to be stacked.

The third material layer 105 may be formed of the same material as that of the first material layer 101, and the fourth material layer 107 may be formed of the same material as that of the second material layer 103.

Subsequently, a mask pattern 111 may be formed on the second stack STA2. The mask pattern 111 is formed with an opening that opens a region in which a hole 115 is to be formed.

Thereafter, the second stack STA2 and the first stack STA1 are etched through an etching process using the mask pattern 111 as an etch barrier. Consequently, the hole 115 passing through the second stack STA2 and the first stack STA1 is formed.

Subsequently, a first blocking insulating layer 121, a data storage layer 123, and a tunnel insulating layer 127 are successively formed on the sidewall of the hole 115. Thereafter, a first semiconductor layer 129 extending along the sidewall of the hole 115 is initially deposited on the tunnel insulating layer 127. The initially-deposited first semiconductor layer 129 may be a silicon layer, which may be easily deposited. Hereinafter, for the sake of description, the initially-deposited first semiconductor layer 129 will be referred to as a first silicon layer. Subsequently, the central region of the hole 115 defined by the first silicon layer 129 is filled with insulating material 131.

Referring to FIG. 4B, the insulating material 131 is etched to define a core insulating layer 131P. Thereafter, a portion of the first silicon layer 129 that is exposed out of the core insulating layer 131P may be etched. As a result, the first silicon layer 129 may remain as a first pattern 129P. The upper region of the hole 115 that has been opened by removing the insulating material 131 and the first silicon layer 129 is defined as a recess region 135.

To define the recess region 135, the portion of the insulating material 131 and the portion of the first silicon layer 129 that pass through the second stack STA2 may be removed using a wet etching process. The depth of the recess region 135 may be adjusted such that at a least portion of the recess region 135 is enclosed by the fourth material layer 107 disposed in the uppermost layer of the second stack STA2. For this, an etching rate of the insulating material 131 and the first silicon layer 129 may be controlled.

Figure 4C:
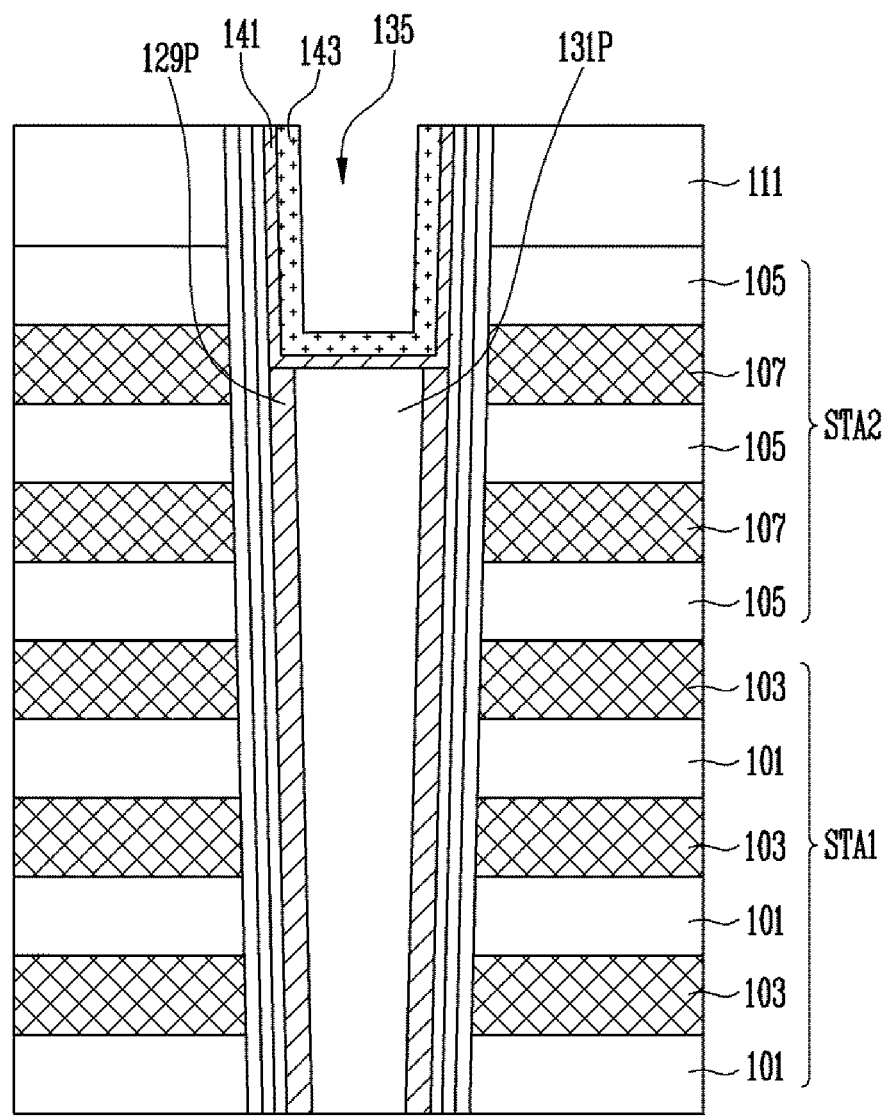

Referring to FIG. 4C, a first semiconductor layer 141 is secondarily deposited on a surface of the recess region 135. The secondarily-deposited first semiconductor layer 141 may be a silicon layer, which may be easily deposited. Hereinafter, for the sake of description, the secondarily-deposited first semiconductor layer 141 will be referred to as a second silicon layer.

The second silicon layer 141 may be deposited along the surface of the recess region 135 such that the central region of the recess region 135 is open. Thereafter, a second semiconductor layer 143 is formed on the second silicon layer 141. The second semiconductor layer 143 may be formed of a semiconductor material different from that of the second silicon layer 141 and/or the first pattern 129P formed of the first silicon layer, and the second semiconductor layer 143 may be formed of material having an energy band gap less than that of the first or second silicon layer. For example, the second semiconductor layer 143 may be a germanium layer.

A germanium second semiconductor layer 143 may be formed using the second silicon layer 141 as a seed layer. In more detail, the crystallized second silicon layer 141 and second semiconductor layer 143 may be formed by depositing an amorphous germanium layer on an amorphous second silicon layer and then crystallizing the second silicon layer and the germanium layer.

The second silicon layer 141 and the first pattern 129P are formed of the first semiconductor layers and define a first semiconductor region that overlaps the first stack STA1 and the second stack STA2. The second silicon layer 143 is formed of semiconductor material different from that of the first semiconductor layers that form the second silicon layer 141 and the first pattern 129P, and the second silicon layer 143 defines a second semiconductor region which overlaps the second stack STA2.

Figure 4D:
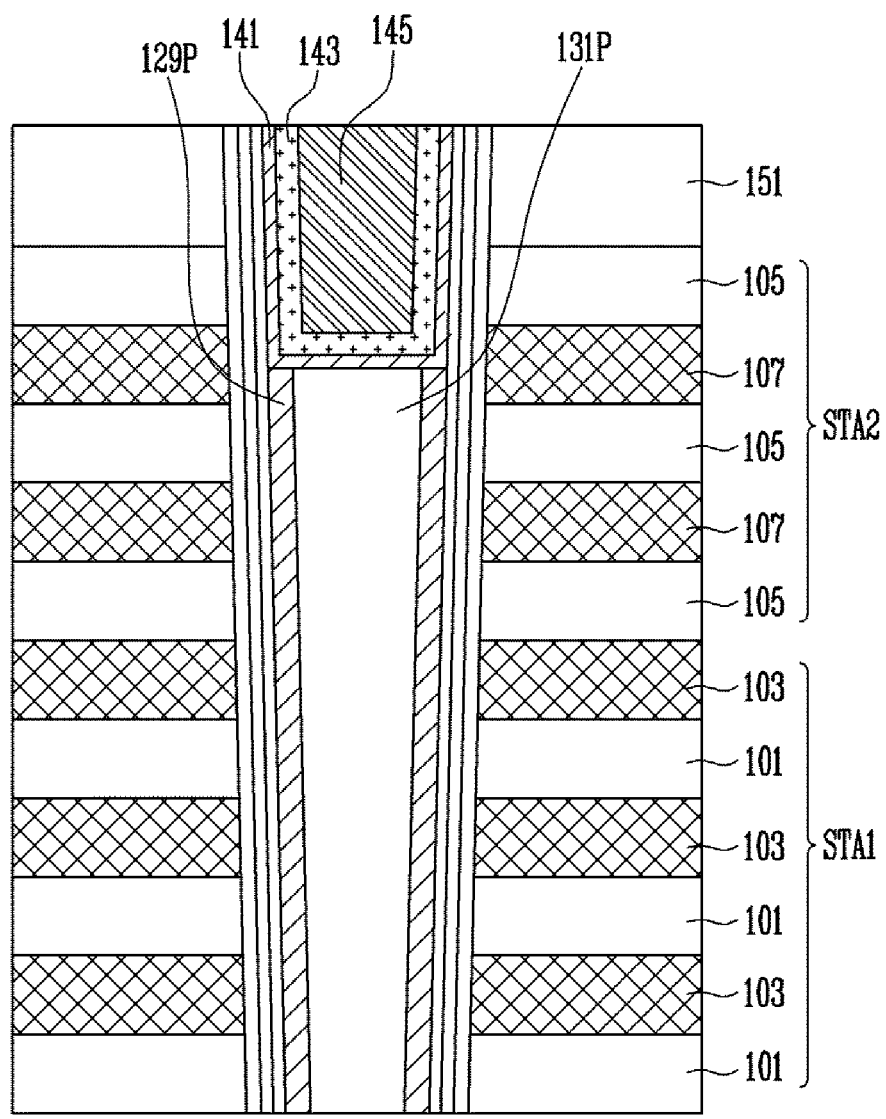

Referring to FIG. 4D, a doped semiconductor layer 145 is formed on the second semiconductor layer 143 so that the recess region 135 is completely filled with the doped semiconductor layer 145. The doped semiconductor layer 145 may be a doped silicon layer including a first conductivity type impurity. In more detail, the doped semiconductor layer 145 may be an n-type doped silicon layer. The first conductivity type impurity of the doped semiconductor layer 145 may be diffused, through a thermal process, into the first semiconductor layer (e.g., 141) and the second semiconductor layer 143 that surround the doped semiconductor layer 145. A surface of the doped semiconductor layer 145 may be planarized until a mask pattern (111 in FIG. 4C) is exposed.

Thereafter, additional processes, such as a process of patterning the first and second stacks STA1 and STA2 in a stepwise shape, a process of removing the mask pattern, and a process of covering the stepwise structure with an insulating layer 151, may be performed.

Figure 5A:
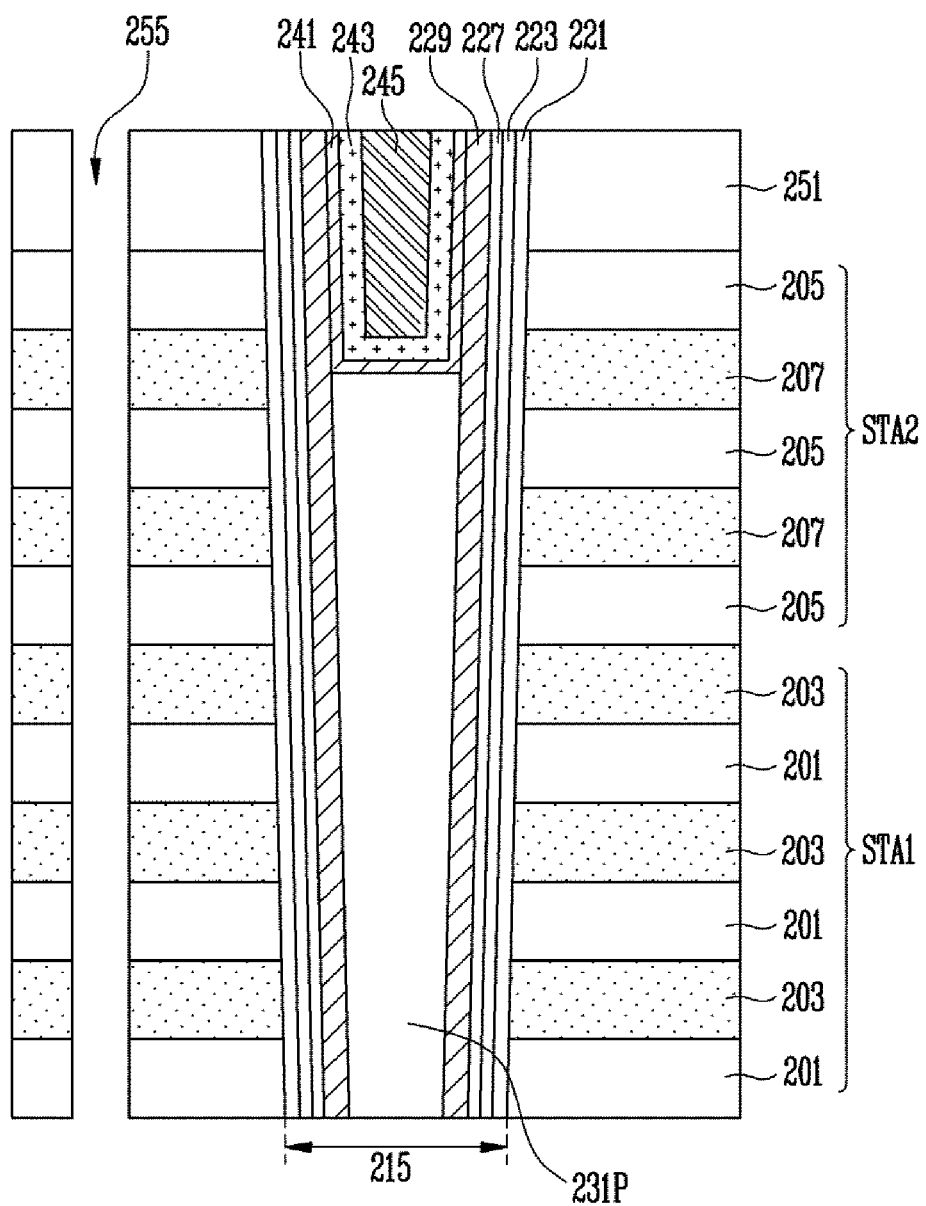
FIGS. 5A to 5C show sectional views illustrating a method of manufacturing a semiconductor device according to an embodiment of the present disclosure.
Figure 5B:
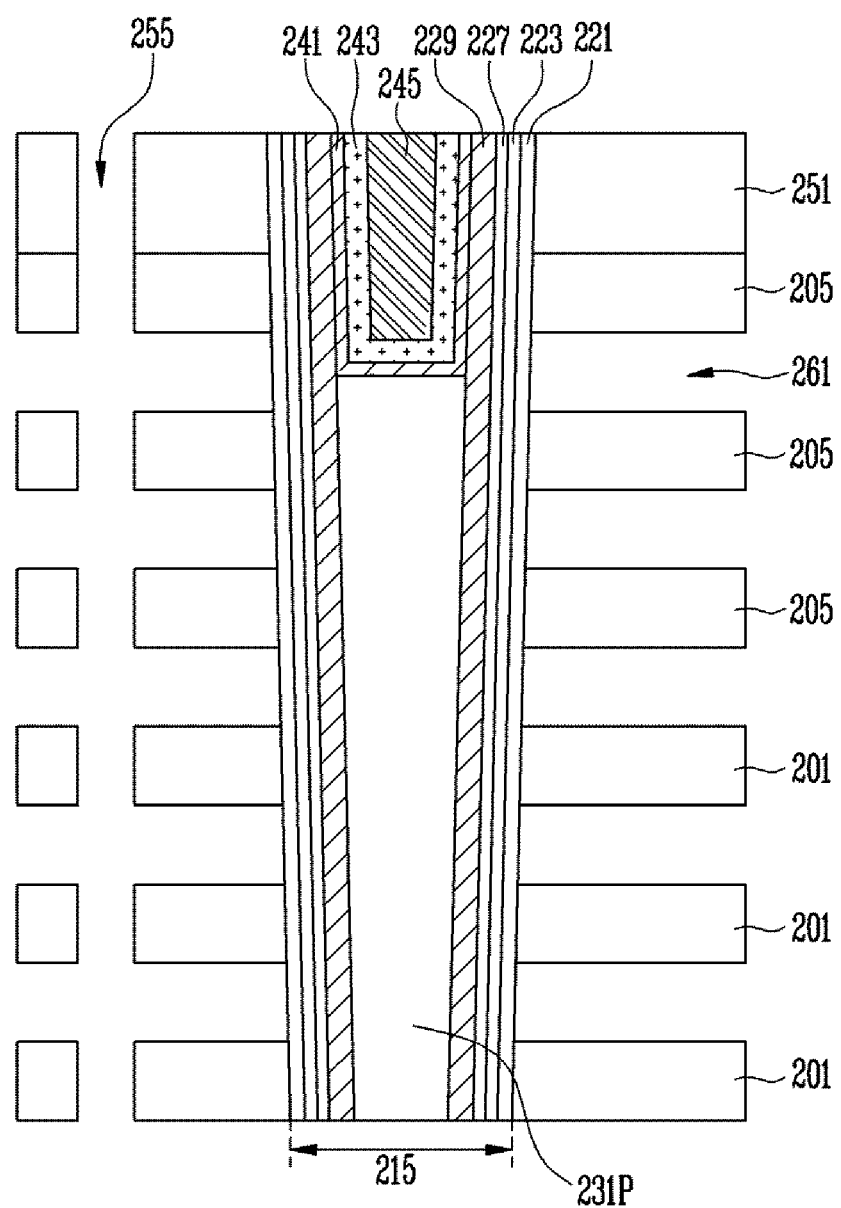
Figure 5C:
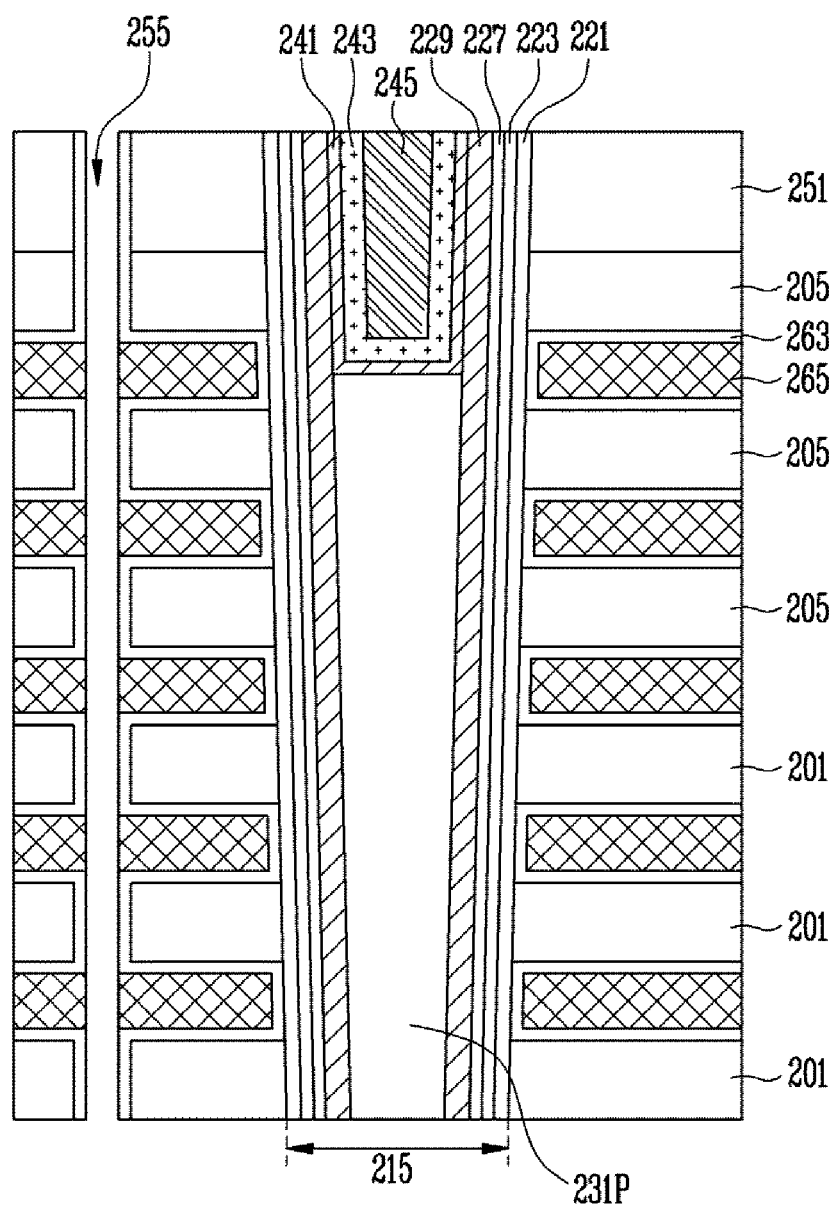

FIGS. 5A to 5C show sectional views illustrating a method of manufacturing a semiconductor device according to an embodiment of the present disclosure. In more detail, FIGS. 5A to 5C show sectional views illustrating an embodiment of a method of manufacturing the semiconductor device shown in FIG. 2B.

Referring to FIG. 5A, a first stack STA1, including first material layers 201 and second material layers 203 that are alternately stacked, and a second stack STA2, including third material layers 205 and fourth material layers 207 that are alternately stacked, are successively formed. The first to fourth material layers 201, 203, 205 and 207 may be formed of various materials in the same manner as described for FIG. 4A. Although FIGS. 5A to 5C illustrate the case where the first and third material layers 201 and 205, which define regions in which insulating layers are disposed, are formed of insulating material, and the second material layers 203, which define regions in which cell gates are disposed, and the fourth material layers 207, which define regions in which select gates are disposed, are formed of sacrificial insulating material, the present disclosure is not limited to this case.

After the second stack STA2 has been formed, a hole 215, a first blocking insulating layer 221, a data storage layer 223, a tunnel insulating layer 227, and a first silicon layer 229 are formed by the same process as that described for FIG. 4A. The first silicon layer 229 is an example of the initially-deposited first semiconductor layer.

Subsequently, a core insulating layer 231P is formed in the same manner as described for FIG. 4B. Thereafter, a second silicon layer 241 is formed while the first silicon layer 229 remains on a sidewall of an upper end of the hole 215 over the core insulating layer 231P. The second silicon layer 241 is an example of the secondarily-deposited first semiconductor layer. As such, when the second silicon layer 241 is deposited, without etching a portion of the first silicon layer 229, in a state in which the tunnel insulating layer 227 is protected by the first silicon layer 229, the tunnel insulating layer 227 is prevented from being exposed and damaged. As a result, the probability of a defect in the tunnel insulating layer 227 may be reduced.

Thereafter, a second semiconductor layer 243 is formed using the second silicon layer 241 as a seed layer. The second silicon layer 241 and the second semiconductor layer 243 may be formed through the same process as that described for FIG. 4C.

Subsequently, as described for FIG. 4D, a process of forming a doped semiconductor layer 245, and a process of diffusing impurities of the doped semiconductor layer 245 into the second silicon layer 241 and the second semiconductor layer 243 that are disposed adjacent the doped semiconductor layer 245 may be successively performed.

Thereafter, a process of patterning the first and second stacks STA1 and STA2 in a stepwise shape, a process of removing a mask pattern, a process of covering the stepwise structure with an insulating layer 251, and a process of forming a slit 255 passing through the insulating layer 251 and the first and second stacks STA1 and STA2 may be performed. The slit 255 may correspond to the slit described for FIGS. 3A to 3C.

Referring to FIG. 5B, the second and fourth material layers 203 and 207 that are formed of the sacrificial insulating materials are removed through the slit 255 so that horizontal spaces 261 open.

Referring to FIG. 5C, a second blocking insulating layer 263 is formed along the surfaces of the horizontal spaces 261 and the slit 255. Thereafter, conductive patterns 265 with which the horizontal spaces 261 are respectively filled may be formed on the second blocking insulating layer 263. The conductive patterns 265 may be used as select gates and cell gates. In particular, the conductive pattern 265 disposed in an uppermost layer is used as a select gate.

The second blocking insulating layer 263 may be omitted in some embodiments.

As described above, FIGS. 5A to 5C illustrate the case where the second and fourth material layers are replaced with the conductive patterns 265. In some instances, this replacing process may be applied to the embodiments described with reference to FIGS. 4A to 4D.

In addition, although not shown in the drawings, in the case where the first and third material layers are formed of sacrificial conductive material, a process of replacing the sacrificial conductive material with insulating material may be performed.

Figure 6:
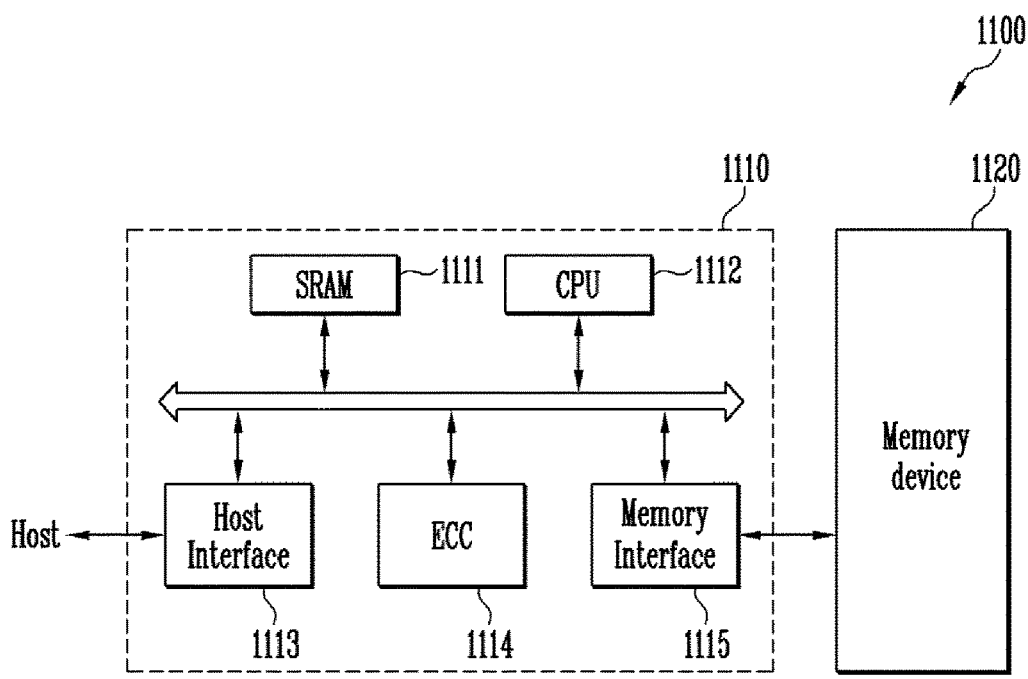
FIG. 6 shows a block diagram illustrating a memory system according to an embodiment of the present disclosure.

FIG. 6 shows a block diagram illustrating a memory system 1100 according to an embodiment of the present disclosure.

Referring FIG. 6, the memory system 1100 includes a memory device 1120 and a memory controller 1110.

The memory device 1120 may include the semiconductor memory device described with reference to FIGS. 2A to 2B. In more detail, the memory device 1120 may include a select gate enclosing a region in which a first semiconductor region and a second semiconductor region overlap each other. The first semiconductor region and the second semiconductor region are formed of different semiconductor materials.

The memory device 1120 may be a multi-chip package including a plurality of flash memory chips.

The memory controller 1110 may be configured to control the memory device 1120. As shown, the memory controller 1110 includes a static random access memory (SRAM) 1111, a CPU 1112, a host interface 1113, an error correction code (ECC) circuit 1114, and a memory interface 1115. For an embodiment, the SRAM 1111 is used as an operation memory of the CPU 1112. The CPU 1112 performs overall control operations for data exchange with the memory controller 1110. The host interface 1113 is provided with a data interchange protocol of a host coupled with the memory system 1100. Furthermore, the ECC circuit 1114 detects and corrects errors included in the data read from the memory device 1120, and the memory interface 1115 interfaces with the memory device 1120. In addition, the memory controller 1110 may further include read only memory (ROM) or the like that stores code data for interfacing with the host.

The above-described memory system 1100 may be a memory card or a solid state disk (SSD) equipped with the memory device 1120 and the controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE).

Figure 7:
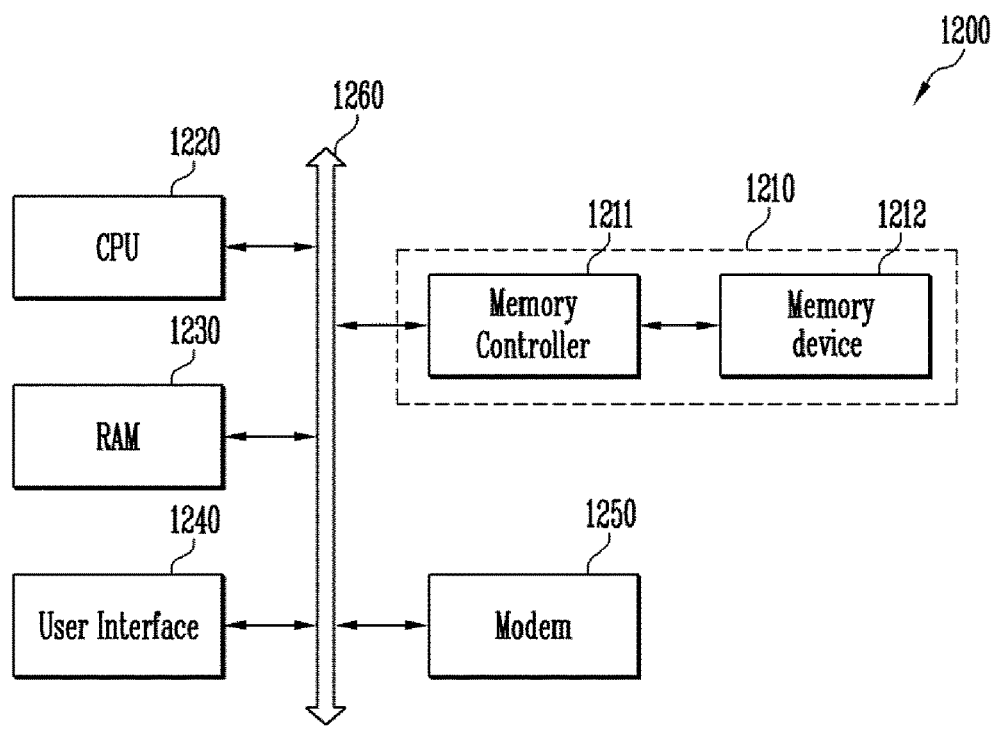
FIG. 7 shows a block diagram illustrating a computing system according to an embodiment of the present disclosure.

FIG. 7 shows a block diagram illustrating a computing system 1200 according to an embodiment of the present disclosure.

Referring to FIG. 7, the computing system 1200 may include a CPU 1220, random access memory (RAM) 1230, a user interface 1240, a modem 1250, and a memory system 1210 that are electrically interconnected via a system bus 1260. Furthermore, if the computing system 1200 is a mobile device, then it may further include a battery for supplying an operating voltage to the computing system 1200. An application chip set, a camera image processor CIS, a mobile DRAM and the like may be further included.

As described above with reference to FIG. 6, the memory system 1210 may be configured with a memory device 1212 and a memory controller 1211.

According to an embodiment of the present disclosure, double semiconductor regions formed of different semiconductor materials overlap a select gate, whereby efficiency of generating holes may be increased. As a result, erase operation characteristics of the semiconductor device may be enhanced.

According to an embodiment of the present disclosure, because a sufficient amount of holes may be generated even when a bias for an erase operation is not increased, deterioration in characteristics of the select transistor by a high bias may be reduced.

Embodiments have been disclosed herein, and although specific terms are employed, they are used and are to be interpreted in a descriptive sense and not for purpose of reading any limitations into presented embodiments. In some instances, as would be apparent to one of ordinary skill in the art as of the filing of the present application, features, characteristics, and/or elements described in connection with a particular embodiment may be used singly or in combination with other features, characteristics, and/or elements described in connection with other embodiments unless otherwise indicated. Accordingly, it will be understood by those of skill in the art that various changes in form and detail may be made to presented embodiments without departing from the spirit and scope of the present disclosure as set forth in the following claims.

What is claimed is:

1. A method of manufacturing a semiconductor device, comprising:
   forming a first stack, wherein the first stack includes first material layers and second material layers that are alternately stacked;
   forming a second stack on the first stack, wherein the second stack includes at least one third material layer and at least one fourth material layer;
   forming a hole that passes through the first stack and the second stack;
   forming a first layer along a sidewall of the hole;
   filling a central region of the hole with an insulating material;
   opening a portion of the hole passing through the second stack by removing a portion of the insulating material;
   forming a second layer along a surface defined by the open portion of the hole, wherein the first layer and the second layer create a first semiconductor layer;
   forming a second semiconductor layer along a surface of the second layer, wherein the second semiconductor layer is formed of a semiconductor material that is different from a semiconductor material from which the first semiconductor layer is formed; and
   forming a doped semiconductor layer on the second semiconductor layer such that the doped semiconductor layer is spaced from the first semiconductor layer by the second semiconductor layer disposed between the doped semiconductor layer and the first semiconductor layer, wherein the doped semiconductor layer is doped with first conductivity type impurities.

2. The method according to claim 1, wherein an energy band gap of the second semiconductor layer is less than an energy band gap of the first semiconductor layer.

3. The method according to claim 1, wherein the first semiconductor layer comprises a silicon layer, and wherein the second semiconductor layer comprises a germanium layer.

4. The method according to claim 1, further comprising, before the forming of the second layer, etching a portion of the first layer exposed by removing the insulating material.

5. The method according to claim 1, further comprising diffusing the first conductivity type impurities into the second semiconductor layer and into a portion of the second layer surrounding the second semiconductor layer.

6. The method according to claim 1, wherein the first conductivity type impurities comprise an n-type dopant.

7. The method according to claim 1, wherein:
   the first and the at least one third material layers define regions in which insulating layers are disposed;
   the second material layers define regions in which cell gates are disposed;
   the at least one fourth material layer defines a region in which a select gate is disposed; and
   the at least one fourth material layer surrounds a portion of a sidewall of the first layer, a portion of a sidewall of the second layer and a portion of a sidewall of the second semiconductor layer.

* * * * *